(12) United States Patent
Bernstein et al.

(10) Patent No.: US 8,234,554 B2
(45) Date of Patent: Jul. 31, 2012

(54) SOFT ERROR CORRECTION IN SLEEPING PROCESSORS

(75) Inventors: Kerry Bernstein, Underhill, VT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 1055 days.

(21) Appl. No.: 12/170,462

(22) Filed: Jul. 10, 2008

(65) Prior Publication Data

US 2010/0011278 A1  Jan. 14, 2010

(51) Int. Cl.
*H03M 13/00* (2006.01)
(52) U.S. Cl. .......... 714/785; 714/727; 714/764
(58) Field of Classification Search .......... 714/785, 714/727, 724, 726, 764
See application file for complete search history.

(56) References Cited

U.S. PATENT DOCUMENTS

| | | | |
|---|---|---|---|
| 5,410,268 A | 4/1995 | Sharpe-Geisler | |
| 5,493,574 A * | 2/1996 | McKinley | 714/773 |
| 6,662,107 B2 * | 12/2003 | Gronemeyer | 701/213 |
| 6,668,341 B1 | 12/2003 | Krauch et al. | |
| 6,985,811 B2 * | 1/2006 | Gronemeyer | 701/213 |
| 7,320,114 B1 | 1/2008 | Jain et al. | |
| 7,809,975 B2 * | 10/2010 | French et al. | 714/3 |
| 2002/0186040 A1 | 12/2002 | Ooishi | |
| 2003/0067322 A1 | 4/2003 | Stan et al. | |
| 2006/0006900 A1 | 1/2006 | Kinkade et al. | |
| 2007/0103201 A1 | 5/2007 | Lau et al. | |

* cited by examiner

Primary Examiner — Fritz Alphonse
(74) Attorney, Agent, or Firm — Cantor Colburn LLP; Michael LeStrange

(57) ABSTRACT

An error-correction code is generated on a line-by-line basis of the physical logic register and latch contents that store encoded words within a processor just before the processor is put into sleep mode, and later-generated syndrome bits are checked for any soft errors when the processor wakes back up, e.g., as part of the power-up sequence.

14 Claims, 1 Drawing Sheet

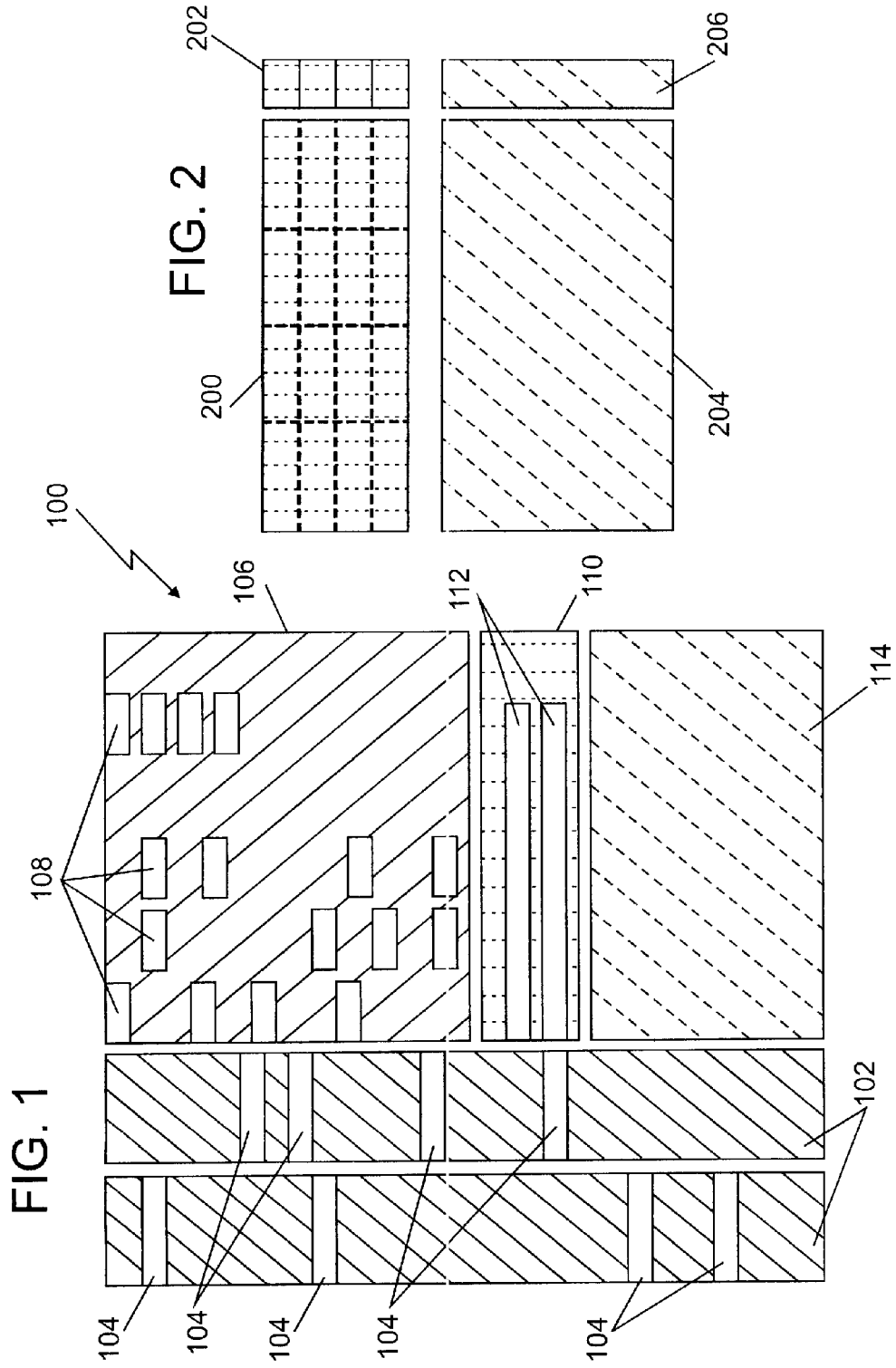

SOFT ERROR CORRECTION IN SLEEPING PROCESSORS

BACKGROUND

The present invention relates generally to processors, and, more particularly, to correction of soft errors that may occur in sleeping processors.

In low power applications, processors (e.g., microprocessors) are often put into a low-voltage sleep mode when they go idle after completing a function. During this period of time, and especially in processors built with deeply scaled technologies, there is an increasing risk for radiation-induced (i.e., "soft") errors to occur in the registers and latches holding the processor machine state data. In memory this is not a problem as encoded data can be stored along with the actual word to later perform error detection when that word is retrieved from memory. But within the processor logic, the bits that comprise each of the stored register words heretofore have had no error checking applied thereto.

BRIEF SUMMARY

According to an embodiment of the invention, an error-correction code is generated on a line-by-line basis with regard to a virtual array (i.e., multiple lines) of physical logic registers and latches (hereinafter "registers") that store words within a processor just before the processor is put into sleep mode, and the syndrome bits are checked for any soft errors when the processor wakes back up, e.g., as part of the power-up sequence.

BRIEF DESCRIPTION OF THE SEVERAL VIEWS OF THE DRAWINGS

Referring to the exemplary drawings wherein like elements are numbered alike in the several Figures:

FIG. 1 is a schematic layout of physical registers and a memory array included within a microprocessor; and FIG. 2 is a schematic layout of a virtual array of physical registers of the microprocessor of FIG. 1 along with the memory array of FIG. 1 in accordance with an embodiment of the invention.

DETAILED DESCRIPTION

Disclosed herein is a method for correction of soft errors in sleeping processors. Briefly stated, an embodiment of the invention associates all logic registers within a processor into a virtual array of registers. Specifically, when a processor enters a low power sleep mode, error-correction code ("ECC") generation circuitry is enabled, which generates ECC logic words associated with virtual array lines comprising the microprocessor logic registers. The processor then enters the sleep mode. It is during this potentially extended period of time that the processor machine state is at its biggest risk for soft errors, primarily because the occurrence of soft errors is strongly and inversely dependent on supply voltage. When the processor is instructed to wake up, a part of the wake-up sequence is to generate the syndrome bits for any needed correction of the stored register words, for example, from the combination of a stored ECC logic word and a corresponding stored original register word. The syndrome bits can then either correct the contents of the physical register(s) on the fly transparently, since power-on sequencing usually requires multiple machine cycles, or more simply, to flag a false machine state and to regenerate the false register content. Thus, an embodiment of the invention mimics the ECC procedure performed on memories.

Referring to FIG. 1, there illustrated is a schematic design 100 of a number of physical logic registers and a memory array included within a microprocessor. The design 100 includes two columns 102 of dataflow logic, each column 102 having one or more registers 104, with the two dataflow columns 102 comprising one of several "terrains" of the microprocessor. In modern microprocessors, the registers 104 in these columns 102 are relatively wide, for example, 64-bits or 128-bits. The design 100 also includes a random logic section 106, or "terrain", having a plurality of registers 108, for example 4-bits wide. The design 100 further includes a custom logic section 110, or "terrain", having a pair of registers 112 as shown in FIG. 1. In addition, the design 100 includes an array 114, which may comprise SRAM cache memory cells along with the ECC or parity logic.

Referring to FIG. 2, in accordance with an embodiment of the invention, there illustrated is a schematic layout of a virtual "conceptual" array arrangement 200 of the physical registers 104, 108, 112 from the various "terrains" 102, 106, 110 within the microprocessor of FIG. 1. This array represents a virtual organization of the logical registers 104, 108, 112 of FIG. 1 into a plurality of lines. This enables creation of new ECC logic words in a section 202 for any needed logic correction associated with the registers 104, 106, 110, when the processor awakes from sleep mode. The ECC logic words in the section 202 are generated on a line-by-line basis within the virtual array 200. In particular, the virtual array 200 comprises a series of relatively long lines that each comprise the contents of the various physical registers 104, 108, 112 of the processor in FIG. 1 stacked together in the array 200. The section 202 that includes the ECC logic words may be organized for convenience in data locality or timing. As such, the section 202 is similar to the ECC array words typically used for memory detection and/or correction. Thus, an embodiment of the invention mimics the ECC procedure performed on memories. A virtual array 204 that corresponds to the array 114 in FIG. 1 is also provided, along with the existing ECC array words 206 of the array 204.

When the microprocessor is instructed to enter into a low power sleep mode, the ECC generation circuitry within the array 114 (FIG. 1) is enabled, which builds an encoded version of the contents of each of the various registers 104, 108, 112 and stores the encoded versions in the ECC section 202 of the virtual array 200. Note that ECC Section 202 is the only new resource which needs to be added to the processor to achieve this function. ECC is a known engineering practice, and various ECC versions use different encoding schemes, which may include Grey Code, Hamming Code, Parity Extension, etc. ECC has been practiced in memory devices for years and has allowed for the generation and storage of a "shorthand" version of the data word(s) stored in the memory devices, which can then be used to recreate the data and check for errors. "Syndrome" bits are output from the ECC circuitry at error checking time, and can be used to correct the data, if needed. ECC schemes of varying complexity allow for capabilities such as simple single error detection, single error detection and correction, and double error detect/single error correct. Thus, while ECC has been used in conjunction with memory devices, there are no known means of generating ECC within the registers that comprise the processor logic, primarily because sleep mode is a newer, rather unusual functional state for microprocessor: register contents are rarely viewed as having extend static content.

Still referring to FIG. 2, after ECC generation the processor goes into a low voltage sleep mode. It is during this potentially extended period of time that the stored processor machine state is at biggest risk for transitioning erroneously, since the occurrence of soft errors is strongly and inversely dependent upon the processor supply voltage. In an embodiment of the invention, when the processor is instructed to wake up, a part of the wake-up sequence is to generate the syndrome bits for any needed correction of the stored word, for example, from the logical combination of the stored ECC logic word and the stored original register word. In the alternative, the syndrome bits can be generated by a comparison of a regenerated ECC logic word upon the wake-up of the processor with the stored ECC logic word. Regardless, the syndrome bits can then either correct the register contents on the fly transparently (if the designer elected to include substructure to alter individual bits) since power-on sequencing usually requires multiple machine cycles, or more simply, to flag a false machine state and to regenerate the false data content.

The ECC registers may be "hardened" with more resilient, SER-immune registers so that the probability of SER-induced failure lies mostly in the high-speed latches within the microprocessor. Also, that the clustering of logic latches into words or lines that can be collectively encoded may be arbitrary, and, as such, does not need to match any logical machine organization. The designer does have the option however, of organizing specific register together into virtual words, so that if power-on sequencing requires some registers earlier than others, the design can accommodate that priority. The generation of error correction code and/or syndrome bits may be qualified only with the instruction to go into sleep mode or come out of sleep mode, so that excess power is not wasted on ECC that is irrelevant about during normal processor operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for correcting any soft errors within logic of a processor that occur while the processor is in a sleep mode, the method comprising:
    building a virtual array of a plurality of registers that comprise the processor logic;
    when the processor enters the sleep mode, generating an error-correction code for each of the plurality of registers within the virtual array; and
    when the processor wakes up from the sleep mode, generating one or more syndrome bits for any needed correction of one of the plurality of registers within the virtual array by one or more of the following:
    logically combining the error-correction code and the corresponding contents of the one of the plurality of registers within the virtual array; and
    comparing a regenerated error-correction code with the existing error correction code for the one of the plurality of registers that needs correction.

2. The method of claim 1, wherein when the processor enters the sleep mode, generating an error-correction code for each of the plurality of registers within the virtual array includes encoding the contents of each of the corresponding plurality of registers within the virtual array.

3. The method of claim 1, wherein when the processor enters the sleep mode, generating an error-correction code for each of the plurality of registers within the virtual array includes storing the generated error-correction code.

4. The method of claim 1, wherein building a virtual array of a plurality of registers that comprise the processor logic includes organizing the virtual array on a plurality of lines of the registers.

5. The method of claim 1, wherein when the processor enters the sleep mode, generating an error-correction code for each of the plurality of registers within the virtual array includes utilizing an efficient data encoding technique.

6. The method of claim 1, wherein when the processor enters the sleep mode, generating an error-correction code for each of the plurality of registers within the virtual array includes generating the error-correction code on a line-by-line basis within the virtual array.

7. A method for correcting any soft errors within logic of a processor that occur while the processor is in a sleep mode, the method comprising:
    organizing a plurality of registers that comprise the processor logic into a virtual array of the registers, wherein the virtual array includes a plurality of lines of the registers;
    when the processor enters the sleep mode, generating an error-correction code for each of the plurality of registers within the virtual array; and
    when the processor wakes up from the sleep mode, generating one or more syndrome bits for any needed correction of one of the plurality of registers within the virtual array by one or more of the following:
    logically combining the error-correction code and the corresponding contents of the one of the plurality of registers within the virtual array; and
    comparing a regenerated error-correction code with the existing error correction code for the one of the plurality of registers that needs correction.

8. The method of claim 7, wherein when the processor enters the sleep mode, generating an error-correction code for each of the plurality of registers within the virtual array includes generating the error-correction code on a line-by-line basis within the virtual array.

9. The method of claim 7, wherein when the processor enters the sleep mode, generating an error-correction code for each of the plurality of registers within the virtual array includes encoding the contents of each of the corresponding plurality of registers within the virtual array.

10. The method of claim 7, wherein when the processor enters the sleep mode, generating an error-correction code for each of the plurality of registers within the virtual array includes utilizing an efficient data encoding technique.

11. The method of claim 7, wherein when the processor enters the sleep mode, generating an error-correction code for each of the plurality of registers within the virtual array includes storing the generated error-correction code.

12. A method for correcting a soft error that occurs within a register of a processor while the processor is in a sleep mode, the method comprising:
   organizing a plurality of processor registers into a virtual array, wherein the virtual array includes a plurality of rows of the registers;
   when the processor enters the sleep mode, generating an error-correction code for each of the plurality of registers within the virtual array;
   storing the error-correction code; and
   when the processor wakes up from the sleep mode, generating one or more syndrome bits for any needed correction of one of the plurality of registers within the virtual array by one or more of the following:
   logically combining the error-correction code and the corresponding contents of the one of the plurality of registers within the virtual array; and
   comparing a regenerated error-correction code with the existing error correction code for the one of the plurality of registers that needs correction.

13. The method of claim 12, wherein when the processor enters the sleep mode, generating an error-correction code for each of the plurality of registers within the virtual array includes encoding the contents of each of the corresponding plurality of registers within the virtual array.

14. The method of claim 12, wherein when the processor enters the sleep mode, generating an error-correction code for each of the plurality of registers within the virtual array includes utilizing an efficient data encoding technique.

* * * * *